United States Patent
Eskildsen et al.

(10) Patent No.: US 6,704,204 B1
(45) Date of Patent: Mar. 9, 2004

(54) IC PACKAGE WITH EDGE CONNECT CONTACTS

(75) Inventors: Steven R. Eskildsen, Folsom, CA (US); Jeffrey C. Franz, El Dorado Hills, CA (US); David S. Brannam, Cameron Park, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/103,110

(22) Filed: Jun. 23, 1998

(51) Int. Cl.[7] .................................................. H05K 1/14
(52) U.S. Cl. ....................................... 361/737; 361/752
(58) Field of Search ................................ 361/736–737, 361/752, 753, 754, 801–802, 459; 439/76.1, 64, 945, 946, 701, 70–71

(56) References Cited

U.S. PATENT DOCUMENTS

| | | | |
|---|---|---|---|
| 4,538,864 A | | 9/1985 | Ichimura |
| 4,695,925 A | * | 9/1987 | Kodai et al. .................. 361/736 |
| 4,780,793 A | * | 10/1988 | Ohtsuki ....................... 361/759 |
| 4,838,804 A | * | 6/1989 | Banjo et al. ................. 439/325 |
| 4,868,714 A | * | 9/1989 | Banjo et al. ................. 361/759 |
| 4,918,513 A | | 4/1990 | Kurose et al. |
| 4,926,034 A | * | 5/1990 | Banjo et al. ................. 235/492 |
| 4,936,784 A | | 6/1990 | Saito |
| 5,036,430 A | * | 7/1991 | Hills .............................. 361/399 |
| 5,073,117 A | | 12/1991 | Malhi et al. |
| 5,408,386 A | * | 4/1995 | Ringer et al. ................ 361/785 |
| 5,437,041 A | * | 7/1995 | Wakabayashi et al. ....... 395/800 |
| 5,476,387 A | | 12/1995 | Ramey et al. ............... 439/76.1 |
| 5,659,459 A | * | 8/1997 | Wakabayashi et al. ....... 361/753 |
| 5,661,634 A | * | 8/1997 | Obata et al. ................. 361/684 |
| 5,735,040 A | * | 4/1998 | Ochi et al. ....................... 29/841 |
| 5,892,660 A | * | 4/1999 | Farnworth et al. ........... 361/728 |
| 5,908,333 A | | 6/1999 | Perino et al. |
| 6,002,589 A | | 12/1999 | Perino et al. |
| 6,234,820 B1 | | 5/2001 | Perino et al. |
| 6,250,934 B1 | | 6/2001 | Eskildsen et al. |

* cited by examiner

*Primary Examiner*—John B. Vigushin
*Assistant Examiner*—Tuan Dinh
(74) *Attorney, Agent, or Firm*—Blakely, Sokoloff, Taylor & Zafman LLP

(57) ABSTRACT

An apparatus and method for allowing the lead pins of an integrated circuit (IC) package to provide the electrical interface between the IC package and a receptacle of the host data processing system is described. The present invention comprises an IC package housed within a card casing to form an IC card, with the leads from the IC package providing the electrical interface between the IC card and the data processing system into which the IC card is inserted. Thus, the present invention eliminates the need for a printed circuit board (PCB) and connector to provide the interconnection between the IC package and the data processing system.

18 Claims, 3 Drawing Sheets

IC PACKAGE WITH EDGE CONNECT CONTACTS

RELATED APPLICATION

The present invention is related to the U.S. Patent Application entitled "IC package with Quick Connect Feature", U.S. Pat. No. 6,250,934 B1, issued Jun. 26, 2001.

BACKGROUND OF THE INVENTION

1. Field of the Invention

The present invention relates to the field of integrated circuits and, more particularly, to a method and apparatus for improved interconnections between an integrated circuit and a data processing system.

2. Descuiption of the Related Art

Integrated circuit (IC) cards (also referred to as electronic function cards) are used with data processing systems to provide increased functionality for the data processing system. IC cards may be used for many purposes such as providing additional memory with a memory card or providing digital storage for such applications as cameras and mobile telephones. IC cards may also provide communication capabilities for a data processing system with external data processing systems or networks by functioning as a modem card, a facsimile card, a local area network (LAN) interface card, and/or a multimedia interface card. The IC cards provide convenience for users in allowing the user to install as needed or desired additional capabilities or features for the data processing system.

IC cards are generally portable cards, often referred to as small form factor cards, that may be inserted into and detached from a receptacle within the data processing system. The small form factor card dimensions are designed to correspond with the particular receptacle into which they will be inserted. Although leads may be soldered between the card and the data processing system, more typically the card has a connector built in and the card is inserted into a receptacle of the host data processing system (also referred to as a host socket). Once inserted into the receptacle of the data processing system, an electrical interface is made between the card connector and the data processing system allowing for communication between the card components and the data processing system.

The IC card itself generally contains a printed circuit board (PCB) attached to a connector, which serves as the IC card connector, with an IC package then mounted on the PCB. Metallized lines on the PCB allow communication between the IC package 10 and the card connector. In electrically connecting the IC package to the PCB, there are typically two levels of interconnection involved. First, an IC die is enclosed within an insulating housing that includes a lead frame having a plurality of leads extending externally from the housing to form an IC package. The leads may be either pins extending from the housing or bump leads on the surface of the housing. The leads are internally connected to the IC die and permit the IC die, now encased within the housing, to connect to and communicate with other devices. The second level of interconnection provides an electrical connection of the IC package and connector to the PCB.

There are different methods of connecting the IC package and connector to the PCB. One standard method, referred to as surface mount technology (SMT), is typically used with a thin small outline package (TSOP). With SMT, the TSOP leads are directly soldered to the PCB. The leads must be placed at the desired location on the PCB and then soldered to the PCB. The coplanarity between the leads and the PCB must be tight, and the location of the leads on the PCB must be accurate. Even with robotics performing the soldering process, the time and expense necessary to ensure a workable interconnection between the IC package and the PCB is great.

When soldering an IC package to a PCB, there is a substantial amount of testing required due to the multiple steps involved in assembling the IC card. First, there is a wafer level test on the IC die. Then, after the IC die has been encased in a housing to form an IC package, the connection between the IC die and the leads of the IC package must be checked. Once the IC package and connector are mounted on the PCB, the connections between the leads on the IC package and connector and the metallized lines of the PCB are tested to ensure that nothing was damaged in the soldering process. After the PCB and the IC package and connector mounted thereon are encased in a card casing to form an IC card, the IC card is tested to ensure a workable electrical interface between the components on the PCB and the receptacle of the data processing system. Often, the tests of the connection between the IC package and connector and the PCB and the final IC card product may be done simultaneously in a single step. Thus, as many as four separate testing phases may be required to ensure that the IC die can effectively communicate with the data processing system.

The present invention describes a method and apparatus allowing the leads of an IC package to provide the electrical interface between the IC package and the data processing system into which the IC package is inserted, without the use of a PCB and connector. Because PCBs and connectors are no longer required to make the connection between the IC package and the data processing system, the manufacturing steps of soldering the IC package onto the PCB and the connector onto the PCB are eliminated. By eliminating the need for soldering both the IC package and the connector to the PCB, less material will be used, fewer leads will be damaged, and significant time will be saved during the assembly process. Additionally, eliminating the interconnections of the IC package and the connector to the PCB reduces the testing requirements during assembly from as many as four steps to as few as two. Thus, the elimination of the PCB and connector within the IC card improves the IC card's reliability while simultaneously decreasing both the expense and time associated with assembling the IC card.

SUMMARY OF THE INVENTION

The present invention describes a method and apparatus allowing the leads of an integrated circuit (IC) package to provide the electrical interface between an IC package and the data processing system into which the IC package is inserted. The present invention comprises an IC package, which is directly inserted into a data processing system. The IC package may be housed within a card casing similar to the form factor cards currently used. When housed within a casing to form an IC card, the leads from the IC package provide the electrical interface between the IC card and the data processing system into which the IC card is inserted.

The present invention eliminates the need for a printed circuit board (PCB) and connector to provide an interconnection between the IC package and the data processing system. The elimination of the PCB and connector greatly reduces the complexity of the assembly of an IC card by eliminating the manufacturing step of soldering the IC package to the PCB. Additionally, testing is simplified since the connections from the IC package to the PCB and the PCB to the card connector are eliminated.

DETAILED DESCRIPTION OF THE INVENTION

Figure 1:
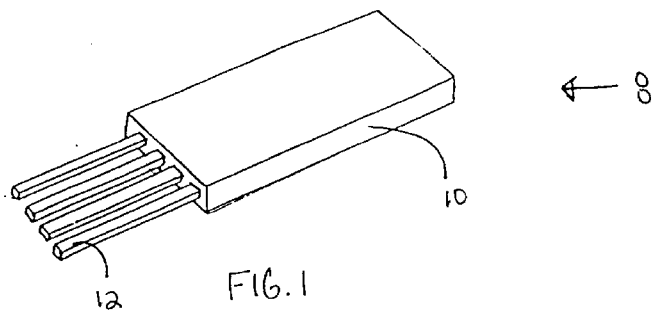
FIG. 1 is a pictorial illustration of an integrated circuit (IC) package with lead pins tending from the IC package.

The following detailed description sets forth several embodiments in accordance with the present invention for allowing the leads from an integrated circuit (IC) package to provide the electrical interface between the IC die and the data processing system into which the IC package is inserted. In the following description, details are set forth such as specific dimensions, IC card applications, configurations, connections, etc., in order to prove a more thorough understanding of the present invention. It will be appreciated by one skilled in the art, however, that the present invention may be practiced without these specific details. In other instances, well-known devices, structures, techniques, etc., have not been described in particular detail so as to not obscure the present invention. Each of the different embodiments of the present invention is discussed as used with a data processing system. Note, however, that each embodiment may be used with other types of data processing devices.

In the prior art, an integrated circuit (IC) card generally contains a printed circuit board (PCB) attached to a connector, which serves as the IC card connector, with an IC package then mounted on the PCB. Metallized lines on the PCB allow communication between the IC package and the card connector. In electrically connecting the IC package to the PCB, there are typically two levels of interconnection involved. First, an IC die is housed within an insulating package that includes a lead frame having a plurality of leads extending externally from the package to form the IC package. The leads may be either pins extending from the package or bump leads on the surface of the package. The leads are internally connected to the IC die and permit the IC die, now encased within the package, to be coupled to other devices. The second level of interconnection provides electrical connections of the IC package and connector to the PCB and involves soldering the IC package and connector to the PCB. This second level of interconnection accounts for a large portion of the time and cost associated with manufacturing an IC card.

The present invention describes an apparatus and method that eliminates the need for the PCB and connector, and the second level of interconnection. Instead of an IC package coupled to a PCB and connector that is then housed within a casing to form an IC card, the present invention comprises an IC package connecting directly to the data processing system, with the IC package containing the functionality of the IC package, PCB, and connector. The IC package may be housed within a card casing (or package) similar to the form factor cards currently used. The IC package is placed within the casing to form an IC card such that when the IC card is inserted into the data processing system, the leads from the IC package serve as the electrical interface between the card and the data processing system.

Note that with the present invention, the IC package component itself may be the final product. This not only eliminates the need for a PCB and connector, but also eliminates the need for a card casing to house the IC package. The IC package component without a casing can be used when a smaller form factor card is required, for example when providing cell phone memory or providing an exchangeable memory interface.

FIG. 1 is a pictorial illustration of an integrated circuit (IC) package with lead pins extending from the IC package, which is a typical IC package for use with the present invention. The IC package 8 is comprised of an IC die encased within a housing 10.

The IC die is mounted on a lead frame having multiple lead pins 12 extending from the housing 10. The lead pins 12 are connected internally to the IC die leads and extend from the housing 10 to allow the now protected IC die to connect to and communicate with other devices.

Figure 2A:
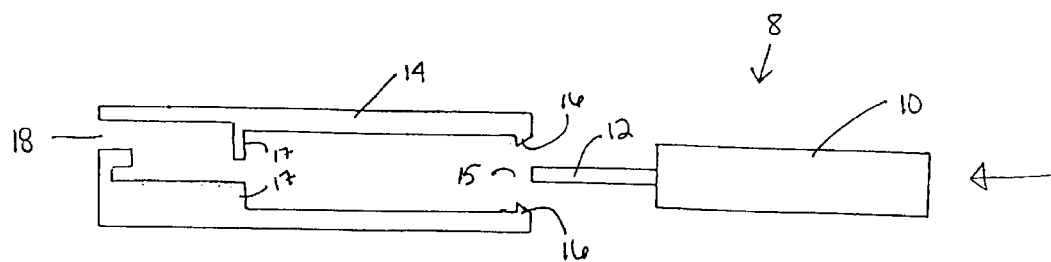
FIG. 2A is a side view of a casing for housing an IC package to form an IC card such that once the IC package is inserted into the casing the leads from the IC package serve as the electrical interface between the IC card and the data processing system into which the IC card is inserted.
Figure 2B:
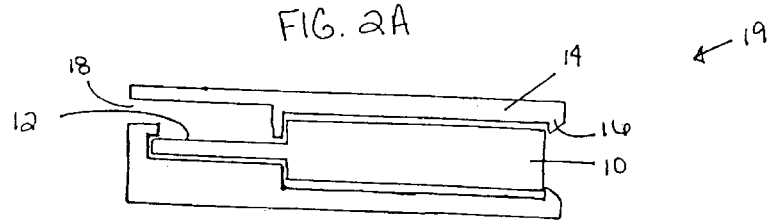
FIG. 2B is a side view of the assembled IC card of FIG. 2A.

FIGS. 2A and 2B are side views of a first embodiment of the present invention. FIG. 2A shows a side view of a casing for housing an IC package to form an IC card such that once the IC package is inserted into the casing the leads from the IC package serve as the electrical interface between the IC card and the data processing system into which the IC card is inserted.

The IC package 8 (see FIG. 1) is inserted into the casing 14 through the back opening 15. The casing 14 is preferably a single piece of plastic formed from injection molding. As with current form factor cards, the dimensions of the casing 14 may be defined by both the size and shape of the IC package that is to be housed within the casing, and the dimensions of the receptacle of the data processing system into which the IC card is inserted. The casing 14 provides both physical and electrostatic discharge (ESD) protection for the IC package 8 encased therein.

As the IC package 8 is inserted into the casing 14, the stops 16 will encounter the front corners of the housing 10 of the IC package 8. However, as the IC package 8 is inserted into the casing 14, the casing 14 will slightly expand and allow the IC package 8 to be inserted past the stops 16. The IC package 8 is inserted into the casing 14 until the front edge of the housing 10 rests against the inner stops 17. Once the IC package 8 is fully inserted into the casing 14, the stops 16 will lower back into position and hold the IC package 8 securely within casing 14. The stops 16 are functioning as snap locks to hold the IC package 8 in place within the casing 14. FIG. 2B is a side of the assembled IC card 19 comprising the casing 14 with the IC package 8 fully inserted therein.

Figure 4A:
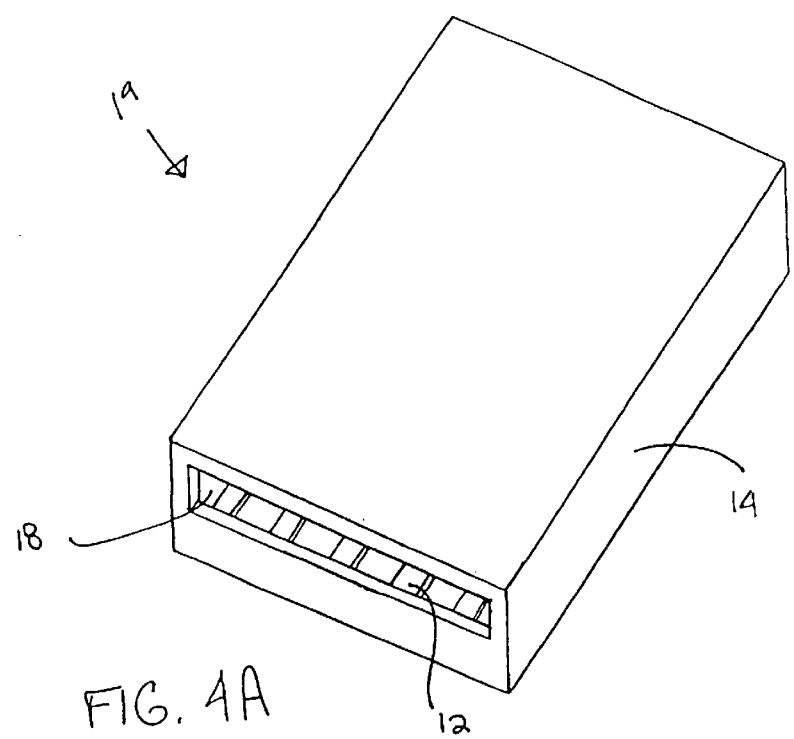
FIG. 4A is a pictorial illustration of an IC card such as the ones shown in FIGS. 2B and 3B.
Figure 4B:
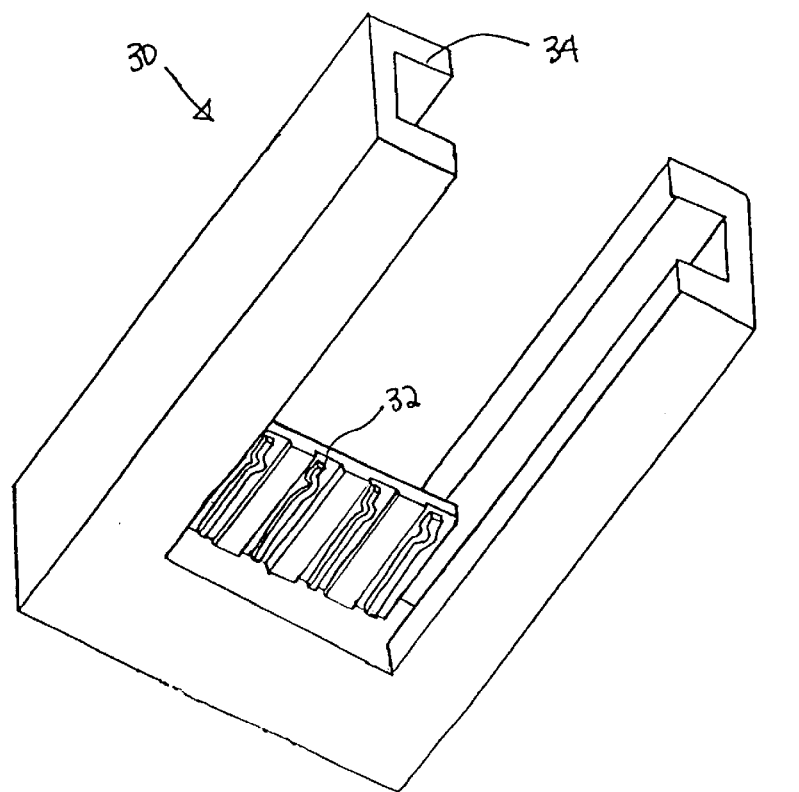
FIG. 4B is a pictorial illustration of a receptacle in the host data processing system corresponding to the IC card shown in FIG. 4A.

FIG. 4A is a pictorial illustration of the casing 14 and the inserted IC package 8. Through a front opening 18, the leads 12 of the IC package 8 are visible. FIG. 4B is a pictorial illustration from a bottom view of a receptacle 30 of a data processing system into which the IC card 19 may be inserted. The IC card 19 is inserted into the receptacle 30 along the guide arms 34. The contacts 32 of the receptacle 30 extend into the opening 18 of the IC card 19 such they are in contact with the leads 12. Typically, the contacts 32 on the receptacle 30 are spring mounted to allow a variation in the exact position and dimensional tolerances of the inserted IC package 8 leads 12 and to ensure the electrical interface is made.

The leads 12 of the IC package 8 form the electrical interface between the IC card 19 and the contacts 32 of the receptacle 30 of the host data processing system. Thus, a PCB and connector are not required to form the interconnection between the IC package and the data processing system. A second embodiment of the present invention is illustrated in FIGS. 3A and 3B.

Figures 3A, 3B:
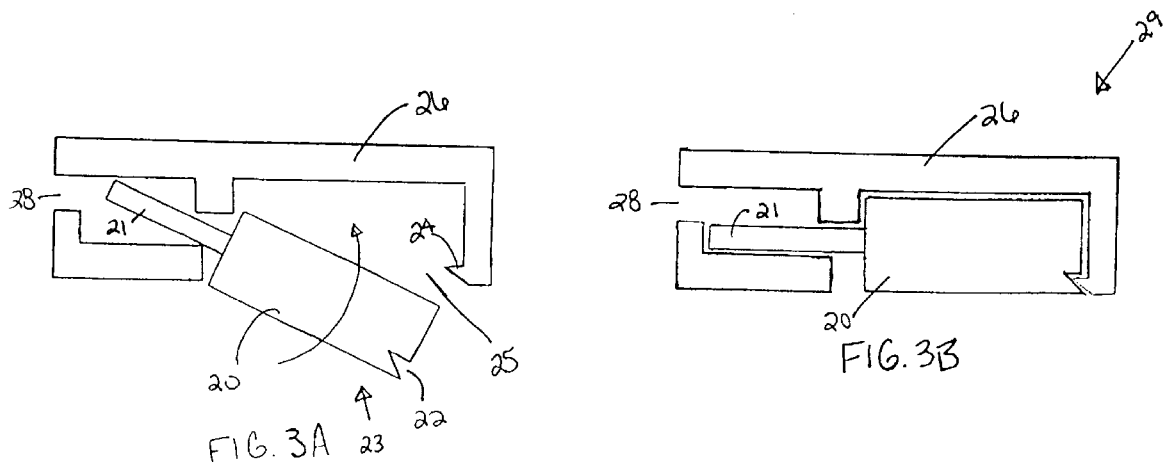
FIG. 3A is a side view of a casing for housing an IC package to form an IC card such that once the IC package is inserted into the casing the leads from the IC package serve as the electrical interface between the IC card and the data processing system into which the IC card is inserted.
FIG. 3B is a side view of the assembled IC card of FIG. 3A.

FIG. 3A is a side view of a casing for housing an IC package to form an IC card such that once the IC package is inserted into the casing the leads from the IC package serve as the electrical interface between the IC card and the data processing system into which the IC card is inserted. Unlike the first embodiment, the second embodiment involves inserting the IC package from the bottom of the casing using a rotating movement.

In this embodiment, an IC package 23, comprised of an IC die encased within a housing 20 with leads 21 connected internally to the IC die and extending from the housing 20, is rotated into position within a casing 26 to form an IC card 29. A bottom opening 25 in the bottom surface of the casing 26 allows the leads 21 of the IC package 23 to be angled into position within the casing 26. The housing 20 of the IC package 23 is then rotated into position within the casing 26. Note that the angled stop 24 on the card casing 26 will encounter the back upper edge of the housing 20 of the IC package 23. The back side of the card casing 26, however, will expand back when pressed upon and allow the IC package 23 to be rotated into position. Once the IC package 23 has been fully rotated into position within the casing 26, the angled stop 24 will move back into its original position and will fit into the angled notch 22 on the housing 20 of the IC package 23. The angled stop 24 residing within the angled notch 22 will hold the IC package 23 within the casing 26 securely. The stop 24 is functioning as a snap lock to hold IC package 23 securely in place within the casing 26. Note that the lower surface of the housing 20 partially forms one side of the IC card 29.

Once the IC package 23 is fully rotated into position within the card casing 26, an IC card 29 is formed that is similar to the card 19 shown in FIG. 4A. The IC card 29 can then be inserted into a receptacle of a data processing system such as the one shown in FIG. 4B. As with the first embodiment described above, the card 29 is inserted into the receptacle 30 along the guide rails 34. The contacts 32 of the receptacle 30 will extend through the opening 28 of the card 29 and contact the leads 21 to form the electrical interface between the IC package 23 and the data processing system and allow communication between the same.

As in the first embodiment, the leads 21 of the IC package 23 form the electrical interface between IC card 29 and the contacts 32 of the receptacle 30 of the host data processing system. Thus, a PCB and connector are not required to form the interconnection between the IC package and the data processing system.

The first and second embodiments described above show an IC package housed within a casing to form an IC card, such that the leads from the IC package provide the electrical interface between the IC card and the data processing system the IC card is inserted into. Although both embodiments are illustrated using an IC package with multiple lead pins extending from the IC package, each embodiment may be modified to allow other types of IC packages, such as packages having bump leads or a blade-on-pad socket system, to be used with the present invention. Likewise, the design of the casing may be modified to conform to a variety of shapes and sizes as required by the user. The casing may also have the opening used to insert the IC package and the opening used to achieve an electrical interface between the IC package and the data processing system positioned in a variety of locations on the casing, as long as the leads from the IC package are able to provide the electrical interface between the IC card and the data processing system. In this manner, IC cards of the prior art are significantly improved through the elimination of a PCB and connector.

The present invention may also be used to allow an IC package itself to be directly inserted into a data processing system. This will not only eliminate the PCB and connector, along with the required interconnections associated with the PCB, connector, and IC package, but will also eliminate the need for a casing to house the IC package. The elimination of the casing is an additional cost savings, both from the elimination of materials and from the decrease in assembly time.

When directly inserting an IC package into a data processing system, the leads of the IC package should be robust and/or supported by the IC die housing to ensure that they may effectively provide the electrical interface between the IC package and the data processing system without a constant threat of damaged leads. Thus, although different types of IC packages may be used, an IC package having a "blade on pad" socket system is preferred when inserting an IC package directly into a data processing system.

Figure 5:
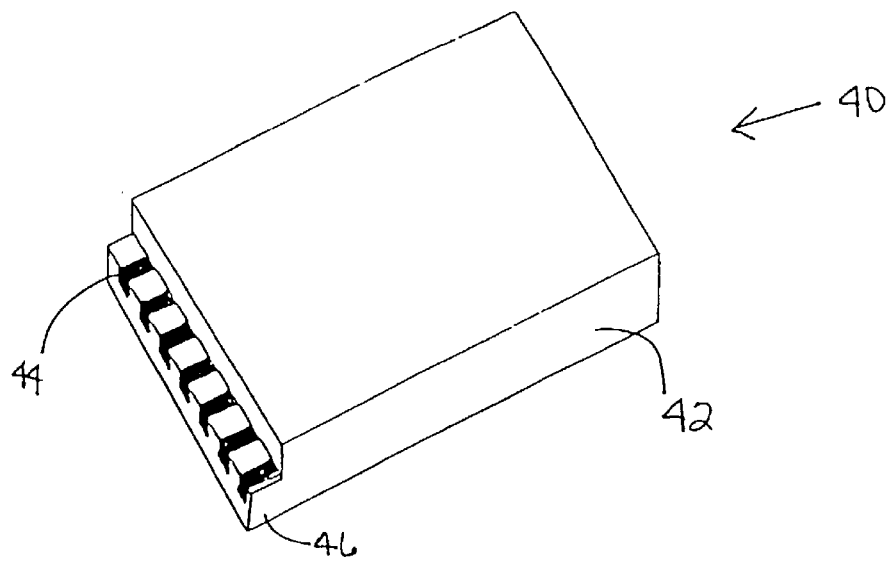
FIG. 5 is a pictorial illustration of an IC package in which the leads are supported and function as a blade on pad connection.
Figure 6:
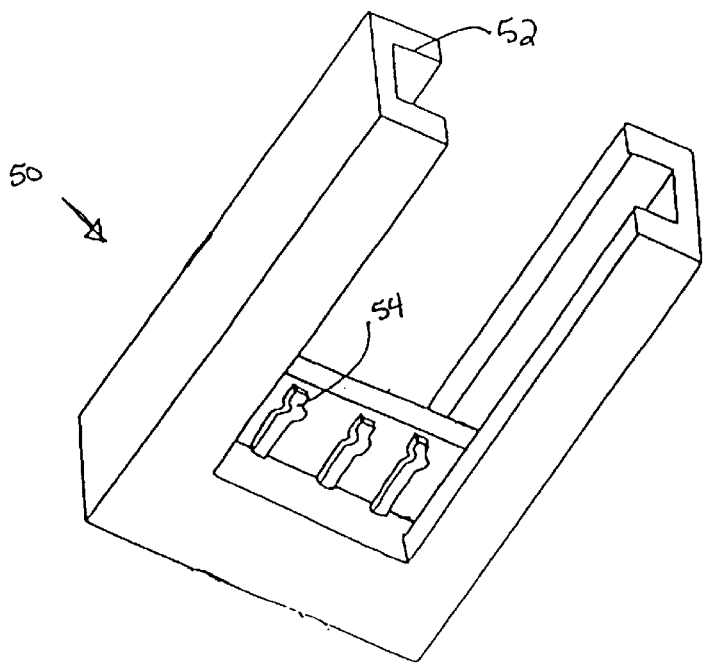
FIG. 6 is a pictorial illustration of a receptacle in the host data processing system in which the IC package shown in FIG. 5 may be directly inserted.

FIG. 5 shows an IC package having a "blade on pad" socket system for use with the present invention. In the IC package 40, an IC die is encased within the housing 42 and leads 44 are internally coupled to the IC die and extend from the housing 42 to allow the IC die to be connected to and communicate with other devices. Unlike the IC package 8 with the lead pins 12 shown in FIG. 1, this IC package 40 uses what is typically referred to as pads in a "blade on pad" socket system. A blade on pad IC package is one where the leads 44 are supported by a support 46 of the housing 42. The leads 44 are generally flush with the upper surface of the support 46. Because the leads 44 are supported, the need for a card casing is greatly reduced. Thus, the IC package 40 may itself be directly inserted into a receptacle of a data processing system, such as the one shown in FIG. 6.

The IC package 40 is inserted directly into the receptacle 50 and along the guide arms 52 until the front edge of the support 46 is in contact with the back inner surface 58 of the receptacle So. Contacts 54 will press against the leads 44 when the IC package 40 is fully inserted into the receptacle 50 and will form the electrical interface between the IC package and the data processing system. As in the first two embodiments, the leads 44 of the IC package 40 form the electrical interface with the contacts 54 of the receptacle 50 of the host data processing system. Thus, a PCB, connector, and casing are not required to form the interconnection between the IC package and the data processing system.

In each of the above embodiments, the housing of the IC package is a plastic (organic resin) overmold with the IC die mounted directly onto the lead frame within the housing. In the embodiments requiring a card casing, the casing into which the IC package is inserted is a preferably a single piece of plastic formed from injection molding. As with current form factor cards, the dimensions of the casing of the present invention may be defined by both the size and shape of the IC package that is housed within the casing and the dimensions of the receptacle of the host data processing system into which the IC card is inserted.

The leads from the IC package serving as the electrical interface with the receptacle of the host data processing system will be made according to industry standards, typically of beryllium copper, plated copper, etc. Typically, the contacts on the receptacle of the host data processing system are spring mounted to allow a variation in the exact position and dimension tolerances of the inserted IC package leads and to ensure an electrical interface is made.

Thus, the present invention describes an IC card that eliminates the PCB and connector entirely by allowing the leads from the IC package to serve as the electrical interface between the IC card and the data processing system. Because a PCB with a connector is no longer required to make the connection between the IC package and the data processing system, the manufacturing steps of soldering the IC package and connector onto the PCB are eliminated. By eliminating the need for soldering the IC package and connector to the PCB, less material will be used, fewer leads will be damaged, and significant time will be saved during the assembly process.

We claim:

1. An apparatus for use in a data processing device, comprising:
    an integrated circuit (IC) package having a plurality of outer leads extended outwardly from the IC package;
    a first receptacle for receiving the IC package, the first receptacle including a first opening to receive the plurality of outer leads when the IC package is inserted into the first receptacle through a second opening disposed away from the first opening; and
    a second receptacle disposed on the data processing device for receiving the first receptacle, the second receptacle having a plurality of contacts,
    wherein the plurality of outer leads of the IC package directly contact, via the first opening, with the plurality of contacts of the second receptacle respectively when the first receptacle is inserted into the second receptacle.

2. The apparatus of claim 1, wherein the first opening is a front opening.

3. The apparatus of claim 1, wherein the second opening is a back opening such that the IC package is inserted into the first receptacle from a back of the first receptacle.

4. The apparatus of claim 1, wherein the second opening is a bottom opening such that the IC package is inserted into the first receptacle from a bottom of the first receptacle using a rotating movement.

5. The apparatus of claim 1, wherein the first receptacle provides a physical and electrostatic discharge protection for the IC package.

6. The apparatus of claim 1, wherein the first receptacle further comprises at least one stop disposed at the second opening to securely hold the IC package within the first receptacle.

7. The apparatus of claim 1, wherein the first receptacle having the inserted IC package is removable from the second receptacle without soldering.

8. The apparatus of claim 1, wherein the second receptacle encapsulates at least a portion of the first receptacle when the first receptacle is inserted into the second receptacle.

9. The apparatus of claim 1, wherein the second receptacle is capable of being disposed on the data processing device via soldering and wherein the first receptacle does not directly contact with the data processing device when the first receptacle is inserted into the second receptacle.

10. A method for use in a data processing device, comprising:
    providing an integrated circuit (IC) package having a plurality of outer leads extended outwardly from the IC package;
    providing a first receptacle for receiving the IC package, the first receptacle including a first opening and a second opening disposed away from the first opening;
    inserting the IC package into the first receptacle through the second opening, such that the first opening receives the plurality of outer leads of the IC package; and
    inserting the first receptacle with the inserted IC package into a second receptacle disposed on the data processing device, the second receptacle having a plurality of contacts,
    wherein the plurality of outer leads of the IC package directly contact, via the first opening, with the plurality of contacts of the second receptacle respectively when the first receptacle is inserted into the second receptacle.

11. The method of claim 10, wherein the first opening is a front opening.

12. The method of claim 10, wherein the second opening is a back opening such that the IC package is inserted into the first receptacle from a back of the first receptacle.

13. The method of claim 10, wherein the second opening is a bottom opening such that the IC package is inserted into the first receptacle from a bottom of the first receptacle using a rotating movement.

14. The method of claim 10, wherein the first receptacle provides a physical and electrostatic discharge protection for the IC package.

15. The method of claim 10, wherein the first receptacle further comprises at least one stop disposed at the second opening to securely hold the IC package within the first receptacle.

16. The method of claim 10, wherein the first receptacle having the inserted IC package is removable from the second receptacle without soldering.

17. The method of claim 10, wherein the second receptacle encapsulates at least a portion of the first receptacle when the first receptacle is inserted into the second receptacle.

18. The method of claim 10, wherein the second receptacle is capable of being disposed on the data processing device via soldering and wherein the first receptacle does not directly contact with the data processing device when the first receptacle is inserted into the second receptacle.

* * * * *

UNITED STATES PATENT AND TRADEMARK OFFICE
CERTIFICATE OF CORRECTION

PATENT NO. : 6,704,204 B1
APPLICATION NO. : 09/103110
DATED : March 9, 2004
INVENTOR(S) : Eskildsen et al.

It is certified that error appears in the above-identified patent and that said Letters Patent is hereby corrected as shown below:

In column 3, at line 6, delete "tending" and insert --extending--.

In column 6, at line 62, delete "So" and insert --50--.

Signed and Sealed this

Eighth Day of January, 2008

JON W. DUDAS
*Director of the United States Patent and Trademark Office*